(12) United States Patent
Ribarich et al.

(10) Patent No.: US 7,190,208 B2
(45) Date of Patent: Mar. 13, 2007

(54) SELF-OSCILLATING FULL BRIDGE DRIVER IC

(75) Inventors: Thomas J. Ribarich, Laguna Beach, CA (US); Peter Green, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 5 days.

(21) Appl. No.: 11/099,818

(22) Filed: Apr. 6, 2005

(65) Prior Publication Data

US 2005/0225374 A1 Oct. 13, 2005

Related U.S. Application Data

(60) Provisional application No. 60/560,876, filed on Apr. 8, 2004.

(51) Int. Cl.
*H03K 1/56* (2006.01)

(52) U.S. Cl. ........................ 327/423; 327/587

(58) Field of Classification Search ........ 327/108–112, 327/423, 587; 315/291; 363/72
See application file for complete search history.

(56) References Cited

U.S. PATENT DOCUMENTS

| 4,042,838 A | 8/1977 | Street et al. | |
|---|---|---|---|
| 5,625,548 A | 4/1997 | Gold et al. | |
| 5,963,066 A | 10/1999 | Fukunaga | |
| 6,038,142 A * | 3/2000 | Fraidlin et al. | 363/17 |
| 6,900,600 B2 * | 5/2005 | Rust et al. | 315/291 |
| 6,982,886 B2 * | 1/2006 | Fukumoto | 363/72 |

FOREIGN PATENT DOCUMENTS

| DE | 195 06 977 C2 | 7/1995 |
|---|---|---|
| JP | 2-49388 | 4/1990 |
| JP | 10-285949 | 10/1998 |

OTHER PUBLICATIONS

Notice of Reasons for Rejection issued Aug. 22, 2006 with English Language Translation.
German Office Action issued Apr. 24, 2006 with English Language Translation.

* cited by examiner

*Primary Examiner*—Dinh T. Le
(74) *Attorney, Agent, or Firm*—Ostrolenk, Faber, Gerb & Soffen, LLP

(57) ABSTRACT

A self-oscillating full-bridge driver IC, in which the high-side drivers each have a bootstrap capacitor, and a bootstrap circuit for pre-charging the bootstrap capacitors before starting up the oscillator or supplying control signals to the high-side drivers.

12 Claims, 5 Drawing Sheets

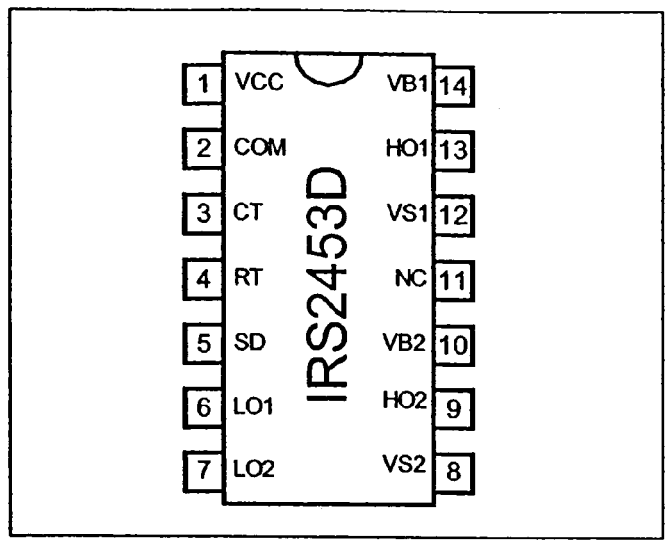

FIG. 4

| | Lead | |
|---|---|---|
| Pin | Symbol | Description |
| 1 | VCC | Logic and internal gate drive supply voltage |
| 2 | COM | IC power and signal ground |
| 3 | CT | Oscillator timing capacitor input |
| 4 | RT | Oscillator timing resistor input |
| 5 | SD | Shutdown input |
| 6 | LO1 | Low-side gate driver output |
| 7 | LO2 | Low-side gate driver output |
| 8 | VS2 | High voltage floating supply return |
| 9 | HO2 | High-side gate driver output |
| 10 | VB1 | High side gate driver floating supply |
| 11 | NC | No connect |
| 12 | VS1 | High voltage floating supply return |
| 13 | HO1 | High-side gate driver output |
| 14 | VB1 | High side gate driver floating supply |

FIG. 5

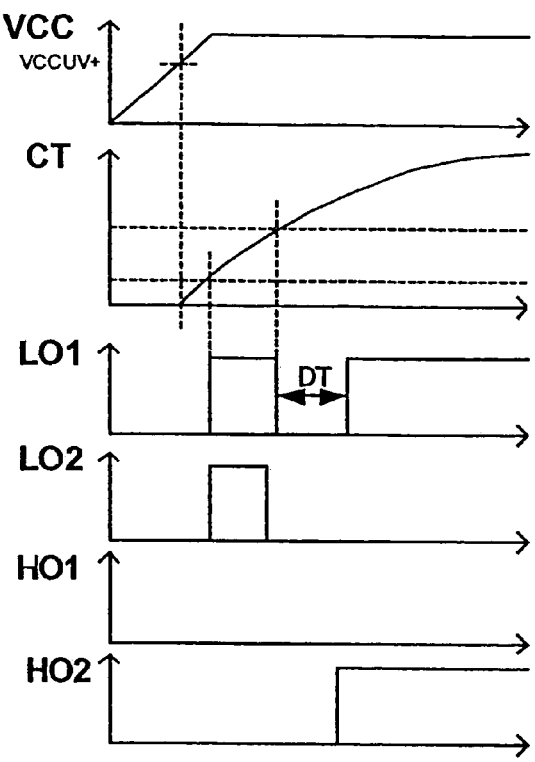
FIG. 7
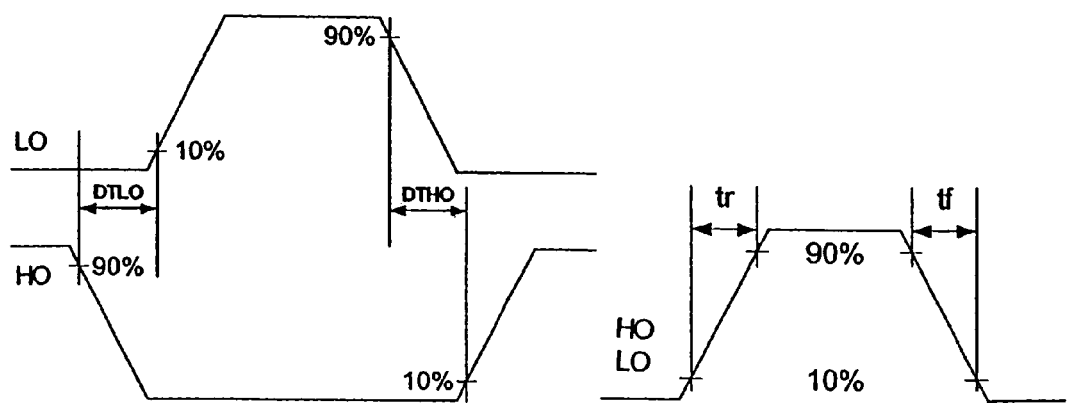
FIG. 8A
FIG. 8B

SELF-OSCILLATING FULL BRIDGE DRIVER IC

CROSS-REFERENCE TO RELATED APPLICATION

The present application is based on and claims priority of U.S. Provisional Application Ser. No. 60/560,876 filed by the present inventors on Apr. 8, 2004, the disclosures of which are incorporated by reference.

BACKGROUND OF THE INVENTION

1. Field of the Invention

The present invention relates to a self-oscillating full-bridge driver IC, and more particularly to a driver having a pre-charging circuit, which may include a bootstrap circuit for pre-charging a bootstrap capacitor before starting up or transferring signals from the oscillator.

2. Related Art

A self-oscillating full-bridge driver of background interest is the IR2153 integrated circuit. A functional block diagram of the IR2153 is shown in FIG. 1. The IR2153 has several features of particular interest:

Under voltage lockout (UVLO) is the name for a protection feature built into several control IC's manufactured by International Rectifier. This block, marked as UV Detect on FIG. 1, ensures that the gate drive outputs, HO and LO are both low should bias become too marginal for comfortable gate drive to the output transistors. The UVLO circuit also assures a repeatable start-up sequence and controls bias current needed for various elements of the IC. The UVLO circuit monitors the bias supply Vcc.

The UVLO circuit is further provided with hysteresis to improve noise immunity. Instead of switching on/off at one voltage level, two threshold levels are defined; one sensitive to a rising edge and the other to a falling edge. In product data sheets describing Vcc undervoltage lockout, these two thresholds are listed as VccUV+ and VccUV−. Hysteresis is a measure of the difference between these two thresholds and is separately listed on data sheets as VccUVH. VccUV+ is the threshold at which the chip is first enabled, when Vcc is rising. Once enabled, Vcc is allowed to drop slightly without adverse effects.

The IR2153 also has micropower start-up, which means that the bias current needed when the IC is in a quiescent state (i.e. not oscillating and Vcc<VccUV) is reduced to a very low level. Micropower start-up is beneficial because off-line applications usually have a single resistor from a high voltage bus for start-up bias to keep component cost and complexity low. In some cases this resistor provides bias for all modes of operation(both start-up and running, where current demand is highest). However, an auxiliary low voltage source is more common for this purpose.

"Bootstrapping" is beneficial because an auxiliary supply can be derived with much higher efficiency than from a simple dropping resistor connected to the line. In bootstrap start-up schemes, the micropower feature allows the pull-up resistor to be increased in value compared to schemes in which a single dropping resistor provides all the bias. This is because the resistor needs only to overcome the quiescent bias current requirements for the IC and raise Vcc to UV+. When the IC starts oscillating, the additional bias requirement is met by an auxiliary supply.

The term "bootstrap" is also used to describe the diode and Vbs capacitor arrangement used in the typical circuit configuration. This part of the circuit serves a different function than the resistor in a bootstrap "start up" scheme. Bootstrap diode/capacitor circuits are described in Design Tip DT-2, by Jonathan Adams, which is available at www.irf.com. incorporated by reference.

The IR2153 further incorporates a fast shutdown mode providing a protective action against fault conditions that would otherwise destroy output switches. Fusing is the simplest option but is often ineffective at preventing damage to semiconductors and is not self-resetting, unless comparatively more expensive devices are used. If the load is capacitively coupled or resonant in nature, for example as in most electronic ballast designs, ample protection may be afforded by merely halting the oscillator and preventing further switching cycles. However, adequate protection sometimes calls for both FET's to be rapidly turned off.

One way to implement shutdown is to pull Vcc below VccUV− so as to turn off both FETs. This requirement may to an extent conflict with the need to provide a healthy charge reservoir and solid decoupling. The shutdown network must be capable of rapidly pulling charge from the Vcc reservoir capacitor (and the decoupling capacitor, if present). Low holding current thyristors can be used to crowbar Vcc and latch the chip off until the supply is recycled. This approach is both simple and inexpensive but does not support automatic power-on reset.

The IR2153 offers a convenient shutdown solution by adding a second function to the Ct pin. A third functional threshold is added to Ct and set at Vcc/6. Below this threshold a fast shutdown mode is invoked and both output buffers are set low with minimal delay. This allows a simple open-collector NPN transistor or similar to be used as part of an inexpensive protection scheme.

IR2153 can be if desired be driven directly as a slave device, for example to complete a fill bridge. The Ct input can be directly fed from a square wave source, provided Vct high>⅔ Vcc and Vct low<⅓ Vcc. The Rt output of any self-oscillating control IC can generate a master clock to feed directly into the Ct input of another, effectively bypassing the internal oscillator of the slaved device. This can be a useful way to implement a full bridge using just one type of IC or hybrid.

IR2153 further has improved dead-time accuracy with zero average temperature coefficient. Dead time is the period during which both HO and LO outputs are intentionally low. This period is fixed inside the IC and serves several essential functions. The primary function of dead-time is to prevent cross conduction or shoot-through in half-bridge designs. If the load is resonant in nature, such as in electronic ballasts and resonant mode power supplies, dead-time also helps maintain zero voltage switching (ZVS). Sometimes called soft switching, this technique significantly reduces switching losses.

Cross-conduction will occur in half bridge circuits if both high and low side transistors are either fully or partially on at the same time. The resulting short across the supply exacerbates EMI, increases dissipation and may destroy power switches, the control IC, or both if extreme. MOSFET turn on/off times are often inequal and vary in production, so dead-time offers a guard band to account for these differences. To prevent cross conduction, or shoot-through, the IR2153 is available with various dead time options. Moreover, switching times can be easily modified using small signal diodes across series resistors in the gate drive loop if necessary.

When the load is inductive or resonant, circuit efficiency is generally highest when zero voltage switching (ZVS or soft switching) occurs. In ZVS, there is just enough time when both FETs are off (approximately equal to the dead-time) to allow load energy to swing the output to the opposite rail, where current will flow into the FET body drain diode. This desirable process is called self-commutation.

Soft switching (ZVS) is more efficient than hard switching. MOSFETSs become hot when the load is removed.

Self-commuation is almost completely lossless because output capacitance of the half bridge rings with the inductive component of the load when both half bridge transistors are off. When the next transistor turns on, the voltage across it is already at or close to zero, so its internal capacitance is already discharged. When its load is not resonant or inductive in nature, the output cannot self-commute to the opposite rail during off time, so the voltage across the next transistor to turn on is high. It must therefore discharge its own output capacitance in addition to providing load current. This explains why half bridge transistors often get hot when there is no load at all, or in ballasts when the lamp is removed and the oscillator is allowed to continue running.

If ZVS is required but the dead-time is too short, there is insufficient time for the half-bridge output voltage to completely self-commutate to the opposite rail. This leaves a fraction of the bus voltage remaining across the output capacitance of both transistors which the next transistor to switch on must discharge. This is partial hard switching (or partial soft switching). Conversely, if the dead-time is too long, the output voltage will self-commutate to the opposite rail, but a short time later, the load current will reverse or ring, producing a voltage transient. Again, the results is partial hard switching and less than optimal switching efficiency. For ZVS, optimal dead time occurs when there is just enough time for self commutation to occur. IR2153 is available with several dead-time options to help meet this requirement. If further adjustments are necessary, small signal diodes can be used in the gate drive loop to independently change charge/discharge timing.

IR2153 output buffers also have a reduced di/dt output stage. This means that the peak rate of change of current (rate of current rise and fall for turn-on and turn-off) has been deliberately reduced. In effect the IR2153 output buffers are turned on and off at a controlled rate.

Benefits of reduced di/dt output buffers include lower gate ringing (Vgs overshoot/undershoot) from a combination of di/dt and gate circuit parasitics. In some cases gate resistors can be eliminated altogether, however this depends on several factors such as layout and transistor type used. Rf interference may also be reduced.

SUMMARY OF THE INVENTION

The invention provides improvements in the type of self-oscillating full-bridge driver described above, and more particularly provides a bootstrap circuit in a driver IC, which may include a circuit for pre-charging a bootstrap capacitor before starting up the oscillator.

According to a general aspect, the invention relates to an integrated control circuit for controlling switching devices arranged in a full bridge for supplying power to a load, comprising: a pair of high-side drivers in the integrated circuit for controlling respective high-side switching devices in the full bridge, the high-side drivers each having a respective high side control terminal for supplying control signals to the corresponding high-side switching device; a pair of low-side drivers in the integrated circuit for controlling respective low-side switching devices in the full bridge; the low-side drivers each having a respective low-side control terminal for supplying control signals to the corresponding low-side switching device; and an oscillator and timing circuits in the integrated circuit supplying control signals for controlling the high- and low-side drivers.

According to another aspect of the invention, a control circuit and method for controlling switching devices for supplying power to a load may comprise a high-side driver for controlling a high-side switching device and a low-side driver for controlling a low-side switching device; said high-side driver having a high-side floating supply terminal and a high-side floating supply return terminal; and a precharging circuit connected to said high-side driver. The precharging circuit may include a bootstrap capacitor connected between the high-side floating supply and floating supply return terminals for contributing power to the high-side driver, and a bootstrap circuit connected to said high-side floating supply terminal for supplying current to charge the bootstrap capacitor.

The invention further may include a method or apparatus in which a timing circuit delivers drive signals to said high-side driver to cause said high-side driver to drive said high-side switching device, and the timing circuit further controls the precharging circuit so that the high-side driver is powered, possibly by charging a bootstrap capacitor, before the high-side driver receives the drive signals.

To carry out these functions, according to a disclosed embodiment of the invention, a bootstrap precharging circuit briefly switches on both of the low-side outputs LO1 and LO2 to allow bootstrap capacitors to fully charge, advantageously before the oscillator starts up. Precharging the bootstrap capacitors helps avoid missing high-side pulses at start up. This feature is incorporated for example in the IRS2453D Self-Oscillating Full-Bridge Driver IC manufactured by International Rectifier.

The IRS2453D is based on the IR2153 self-oscillating half-bridge gate driver IC described above, and incorporates a high voltage full-bridge gate driver with a front end oscillator similar to the industry standard 555 CMOS timer. HVIC and latch immune CMOS technologies enable ruggedized monolithic construction. The output driver features a high pulse current buffer stage designed for minimum driver cross-conduction. Noise immunity is achieved with low di/dt peak of the gate drivers, and with an undervoltage lockout hysteresis greater than 1V. The IRS2453D also includes latched and non-latched shutdown pins.

Other features of the product are:
Integrated 600V Full-Bridge Gate Driver;
CT, RT programmable oscillator;
15.6V Zener Clamp on VCC;
Micropower Startup;
Logic Level Latched Shutdown Pin;
Non-latched shutdown on CT pin (⅙th VCC);
Internal bootstrap FETs;
Latch Immunity on All Inputs & Outputs;
ESD Protection on All Pins;
14-lead SOIC or PDIP package;
1.2 μsec (typical) internal deadtime.

These and other features will be described in the following detailed description of embodiments of the invention, with reference to the drawings.

BRIEF DESCRIPTION OF THE DRAWINGS

FIG. 4 is a diagram showing lead assignments.

FIG. 5 is a table showing lead definitions.

FIG. 7 is a diagram showing the timing of certain signals shown in FIG. 6 at start-up.

FIGS. 8A and 8B show respectively a deadtime waveform and a rise and fall time waveform.

DETAILED DESCRIPTION OF EMBODIMENTS OF THE INVENTION

Under-voltage Lock-Out Mode (UVLO)

The under-voltage lockout mode (UVLO) is defined as the state the IC is in when VCC is below the turn-on threshold of the IC. The IRS2453D under-voltage lock-out is designed to maintain an ultra low supply current of less than 150 μA, and to guarantee the IC is fully functional before the high and low side output drivers are activated. During under voltage lock-out mode, the high-side and low-side driver outputs LO1, LO2, HO1, HO2 are all low. With VCC above the VCCUV+ threshold, the IC turns on and the output begin to oscillate.

Figure 1:
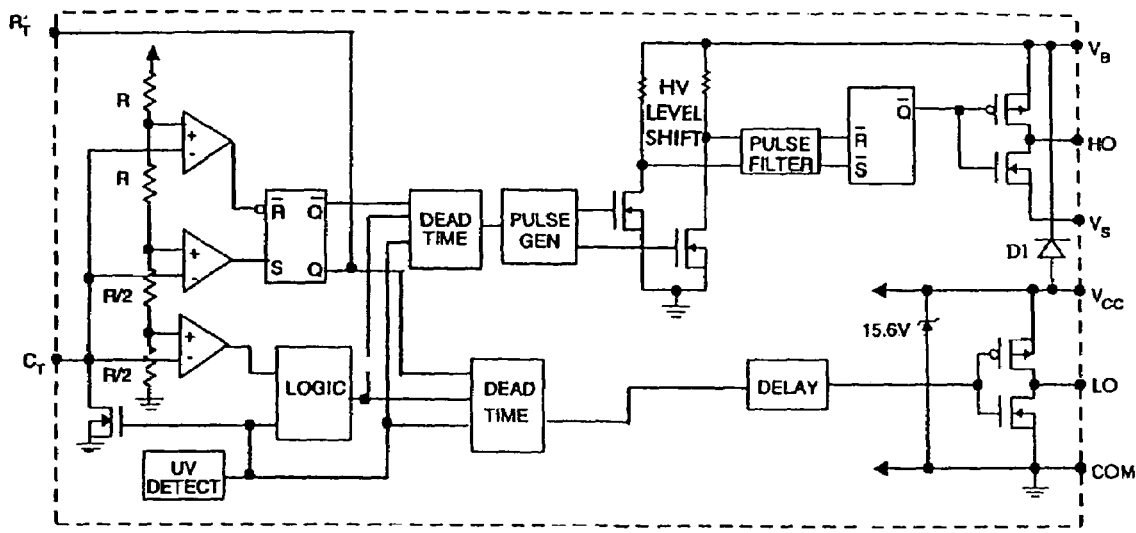
FIG. 1 is a functional block diagram of the prior art IR2153 chip.
Figure 3:
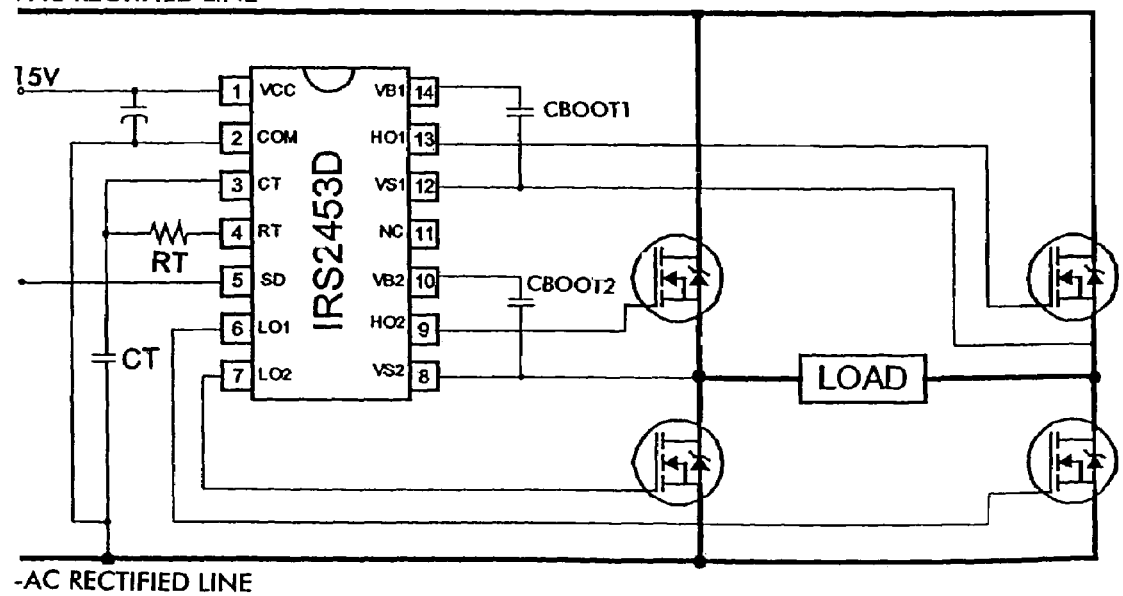
FIG. 3 is a typical connection diagram.
Figure 2:
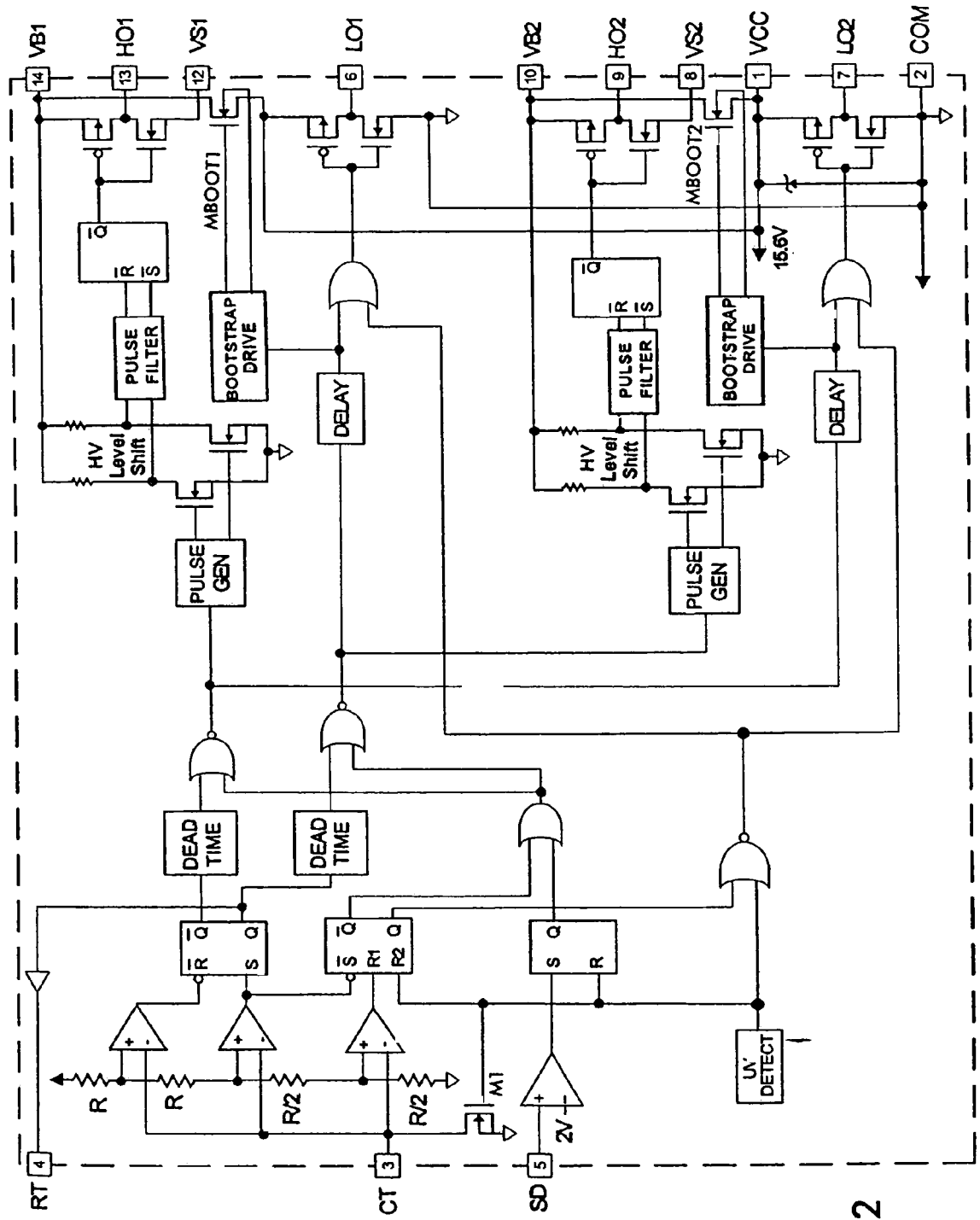
FIG. 2 is a functional block diagram of the IR2453D chip incorporating an embodiment of the invention.
Figure 6:
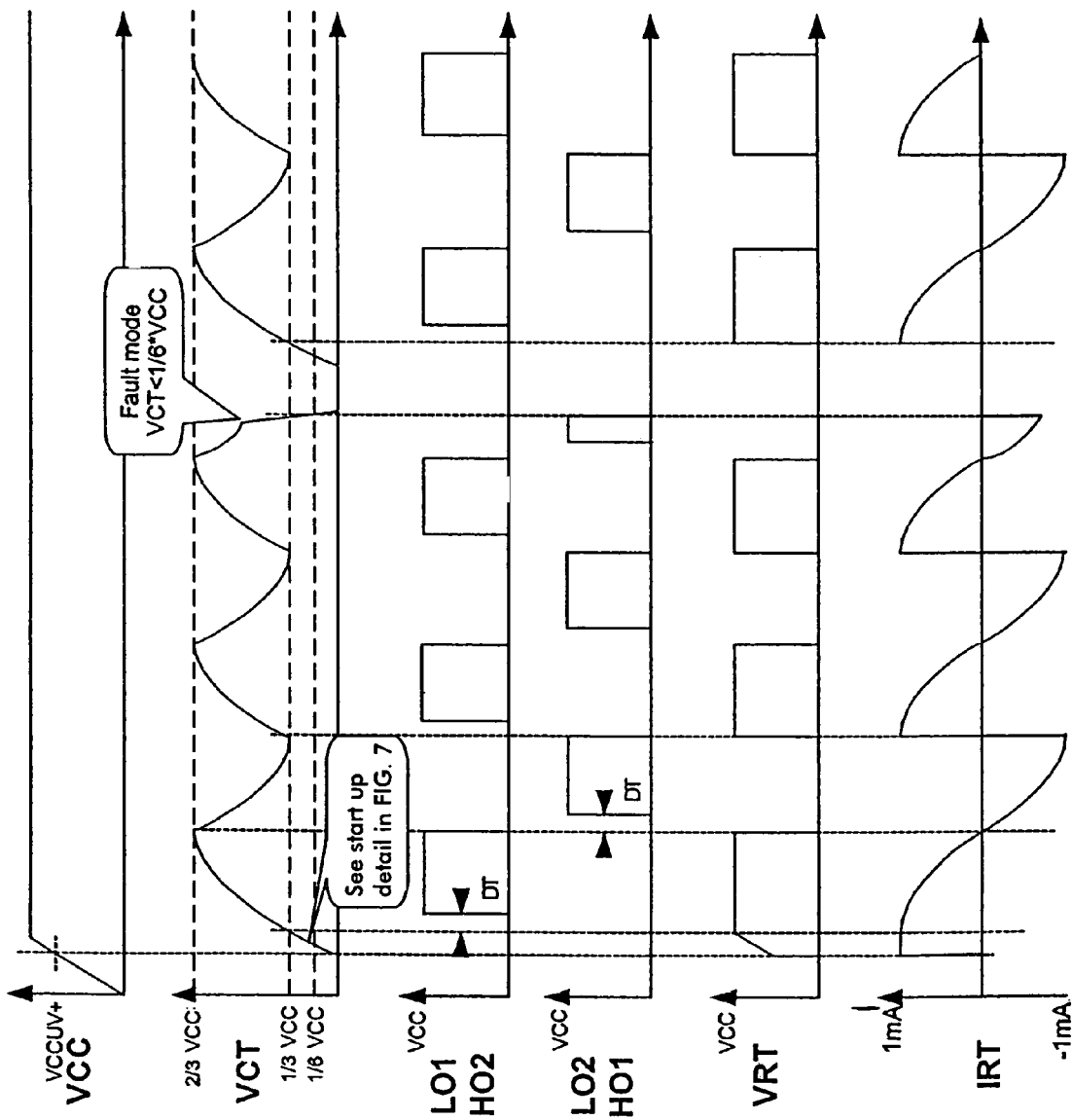
FIG. 6 is a diagram showing the timing of signals in the IR2453D.

Normal Timing/Normal operating mode (FIG. 6)

Once VCC reaches the start-up threshold VCCUV+, the MOSFET M1 opens, VRT increases to approximately VCC (VCC–VRT+) and the external CT capacitor starts charging. Once the CT voltage reaches VCT– (about ⅓ of VCC), established by an internal resistor ladder (R, R, R/2, R/2), LO1 and HO2 turn on with a delay equivalent to the deadtime td. Once the CT voltage reaches VCT+ (approximately ⅔ of VCC), LO1 and HO2 go low, RT goes down to approximately ground (VRT–), the CT capacitor starts discharging and the deadtime circuit is activated. At the end of the deadtime, LO2 and HO1 go high. Once the CT voltage reaches VCT–, LO2 and HO1 go low, RT goes to high again, and the deadtime is activated. At the end of the deadtime, LO1 and HO2 go high and the cycle starts over again.

The following equation provides the oscillator frequency:

$$f = \frac{1}{2 \times \ln(2) \times RT \times CT} = \frac{1}{1.3863 \times RT \times CT}$$

Start-up Timing/Bootstrap MOSFET (FIG. 7)

The internal bootstrap FETs (MBOOT1, MBOOT2) and supply capacitors (CBOOT1 and CBOOT2) comprise the supply voltage (VB1, VB2) for the high side driver circuitry. The internal boostrap FET only turns on when the corresponding LO is high. To guarantee that the high-side supply is charged up before the first pulse on HO1 and HO2, LO1 and LO2 are both on when CT ramps between ⅙*VCC and ⅓*VCC.

As shown in FIG. 7, at start-up, LO1 and LO2 are both high while CT is between ⅙ and ⅓ of VCC, allowing the internal bootstrap MOSFETs MBOOT1 and MBOOT2 connected to VB1 and VB2 to precharge the respective bootstrap capacitors CBOOT1 and CBOOT2.

Non-Latched Shutdown

If CT is pulled down below VCTSD (approximately ⅙ of VCC) by an external circuit, CT does not charge up and oscillation stops. All outputs are held low and the bootstrap FETs are off. Oscillation will resume once CT is able to charge up again to VCT–.

Latched Shutdown

When the SD pin is brought above 2V, the IC goes into fault mode and all outputs are low. VCC has to be recycled below VCCUV– to restart the IC. The SD pin can be used for over-current or over-voltage protection, for example, using appropriate external circuitry.

Although the present invention has been described in relation to particular embodiments thereof, many other variations and modifications and other uses will become apparent to those skilled in the art. Therefore, the present invention is not limited by the specific disclosure herein.

What is claimed is:

1. A control circuit for controlling switching devices for supplying power to a load, comprising:
   a high-side driver for controlling a high-side switching device and a low-side driver for controlling a low-side switching device;
   said high-side driver having a high-side floating supply terminal and a high-side floating supply return terminal;
   a precharging circuit connected to said high-side driver for contributing power to said high-side driver; and
   a timing circuit, said timing circuit delivering drive timing signals to said high-side driver to cause said high-side driver to drive said high-side switching device,
   said timing circuit further delivering precharge timing signals for controlling said precharging circuit so as to power said high-side driver before said high-side driver receives said drive signals.

2. The control circuit of claim 1, wherein said precharging circuit comprises:
   a bootstrap capacitor connected between said high-side floating supply and floating supply return terminals, and
   a bootstrap circuit connected to said high-side floating supply and floating supply terminal for supplying current to charge to said bootstrap capacitor in response to said precharge timing signals.

3. A control circuit for controlling switching devices for supplying power to a load, comprising:
   a pair of high-side drivers for controlling respective high-side switching devices and a pair of low-side drivers for controlling respective low-side switching devices;
   said high-side drivers each having a high-side floating supply terminal and a high-side floating supply return terminal;
   respective precharging circuits connected to said high-side drivers; for contributing power to said high-side drivers;
   a timing circuit, said timing circuit delivering drive timing signals to said high-side drivers to cause said high-side drivers to drive said high-side switching devices,
   said timing circuit further delivering precharge timing signals for controlling said precharging circuits so that said high-side drivers are powered before said high-side drivers receive said drive timing signals.

4. The control circuit of claim 3, wherein said precharging circuits comprise:
respective bootstrap capacitors being connected between said high-side floating supply and floating supply return terminals of each said high-side driver; and
a bootstrap circuit connected to each said high-side floating supply terminal for supplying current to charge the corresponding said bootstrap capacitor in response to said precharge timing signals.

5. The control circuit of claim 4, wherein said timing circuit delivers timing signals simultaneously to both said low-side drivers and thereby actuates both said precharging circuits before supplying said drive timing signals to said high-side drivers.

6. The control circuit of claim 3, wherein said timing circuit delivers timing signals simultaneously to both said low-side drivers and thereby actuates both said precharging circuits before supplying said drive timing signals to said high-side drivers.

7. A method of controlling switching devices for supplying power to a load, said switching devices comprising:
a high-side driver for controlling a high-side switching device and a low-side driver for controlling a low-side switching device;
said high-side driver having a high-side floating supply terminal and a high-side floating supply return terminal;
a precharging circuit connected to said high-side driver for contributing power to said high-side driver;
the method comprising the steps of:
delivering drive signals to said high-side driver from a timing circuit to cause said high-side driver to drive said high-side switching device, and
controlling said precharging circuit with a predetermined signal from said timing circuit so as to power said high-side driver before said high-side driver receives said drive signals.

8. The method of claims 7, wherein said step of controlling said precharging circuit includes the step of charging a capacitor connected between said high-side floating supply and floating-supply return terminals.

9. A method of controlling switching devices for supplying power to a load, said switching devices comprising:
a pair of high-side drivers for controlling respective high-side switching devices and a pair of low-side drivers for controlling respective low-side switching devices;
said high-side drivers each having a high-side floating supply terminal and a high-side floating supply return terminal;
respective precharging circuits being connected to each said high-side driver, for contributing power to the corresponding said high-side driver;
the method comprising the steps of:
delivering drive signals to said high-side drivers from a timing circuit to cause said high-side drivers to drive said high-side switching devices, and
controlling said precharging circuits with a predetermined signal from said timing circuit so as to power said high-side drivers before said high-side drivers receive said drive signals.

10. The method of claim 9, wherein said step of controlling said precharging circuits includes the step of charging respective capacitors connected between said high-side floating supply and floating supply return terminals.

11. The method of claim 10, wherein said controlling step includes simultaneously driving both said low-side drivers and thereby actuating both said precharging circuits before delivering said drive signals to said high-side drivers.

12. The method of claim 9, wherein said controlling step includes simultaneously driving both said low-side drivers and thereby actuating both said precharging circuits before delivering said drive signals to said high-side drivers.

* * * * *